(12) United States Patent
Chen et al.

(10) Patent No.: US 10,242,605 B2
(45) Date of Patent: Mar. 26, 2019

(54) DISPLAY DEVICE HAVING THE BUMPS IN THE MIDDLE ZONE PARALLEL TO THE REFERENCE LINE

(71) Applicant: BOE TECHNOLOGY GROUP CO., LTD., Beijing (CN)

(72) Inventors: Liqiang Chen, Beijing (CN); Hong Li, Beijing (CN)

(73) Assignee: BOE TECHNOLOGY GROUP CO., LTD., Beijing (CN)

( * ) Notice: Subject to any disclaimer, the term of this patent is extended or adjusted under 35 U.S.C. 154(b) by 1 day.

(21) Appl. No.: 15/531,181

(22) PCT Filed: Nov. 5, 2016

(86) PCT No.: PCT/CN2016/081698
§ 371 (c)(1),
(2) Date: May 26, 2017

(87) PCT Pub. No.: WO2017/133116
PCT Pub. Date: Aug. 10, 2017

(65) Prior Publication Data
US 2018/0047314 A1 Feb. 15, 2018

(30) Foreign Application Priority Data

Feb. 4, 2016 (CN) .......................... 2016 1 0081276

(51) Int. Cl.
*H01L 23/48* (2006.01)
*G09F 9/30* (2006.01)
(Continued)

(52) U.S. Cl.
CPC ............... *G09F 9/301* (2013.01); *G09G 3/20* (2013.01); *H01L 21/77* (2013.01); *H01L 23/48* (2013.01);
(Continued)

(58) Field of Classification Search
CPC ....... H01L 23/48; H01L 23/528; H01L 24/14; H01L 2021/60022; H01L 2021/60067; H01L 2224/12; H05K 1/11; H05K 13/046
See application file for complete search history.

(56) References Cited

U.S. PATENT DOCUMENTS 5,061,822 A 10/1991 Spielberger
5,951,304 A * 9/1999 Wildes .................. B81B 7/0006
174/261
(Continued)

FOREIGN PATENT DOCUMENTS

CN 101034213 A 9/2007
CN 101369572 A 2/2009
(Continued)

OTHER PUBLICATIONS

International Search Report of PCT/CN2016/081698 in Chinese, dated Nov. 4, 2016 with English translation.
(Continued)

*Primary Examiner* — Hoai V Pham
(74) *Attorney, Agent, or Firm* — Collard & Roe, P.C.

(57) ABSTRACT

A display device and chip bonding method thereof are provided. The display device includes a flexible display panel and a chip bonded to the non-display area of the flexible display panel with the extension directions of individual bumps satisfying, depending on the area in which the bumps are located, the following requirements: in each row of bumps, at least the individual bumps in lateral zones have their extension lines on the same side converging at a same point on the reference line, and the two bumps belong to a same bump group have their extension lines respectively forming an angle with respect to the reference line, the angles being equal to each other.

14 Claims, 9 Drawing Sheets

(51) Int. Cl.
*H01L 23/528* (2006.01)
*H05K 1/11* (2006.01)
*G09G 3/20* (2006.01)
*H01L 21/77* (2017.01)
*H01L 23/00* (2006.01)
*H01L 27/12* (2006.01)
*H05K 13/04* (2006.01)
*H01L 23/544* (2006.01)

(52) U.S. Cl.
CPC .......... *H01L 23/528* (2013.01); *H01L 23/544* (2013.01); *H01L 24/13* (2013.01); *H01L 24/14* (2013.01); *H01L 24/81* (2013.01); *H01L 27/12* (2013.01); *H05K 1/11* (2013.01); *H05K 13/046* (2013.01); *G09G 2380/02* (2013.01); *H01L 24/16* (2013.01); *H01L 2223/54486* (2013.01); *H01L 2224/11* (2013.01); *H01L 2224/12* (2013.01); *H01L 2224/13012* (2013.01); *H01L 2224/1412* (2013.01); *H01L 2224/16225* (2013.01); *H01L 2224/81125* (2013.01); *H01L 2224/81127* (2013.01); *H01L 2224/81201* (2013.01)

(56) References Cited

U.S. PATENT DOCUMENTS

2007/0222777 A1 9/2007 Nakazawa
2007/0275578 A1 11/2007 Yamada
2008/0284048 A1 11/2008 Kim et al.
2014/0321088 A1 10/2014 Bae et al.
2015/0103500 A1* 4/2015 Bae .................. H01L 24/06
                                                  361/749
2017/0154899 A1 6/2017 Lee

FOREIGN PATENT DOCUMENTS

| CN | 104123902 A | 10/2014 |
| CN | 104979316 A | 10/2015 |
| CN | 105301851 A | 2/2016 |
| CN | 205541677 U | 8/2016 |
| JP | 2007-242942 A | 9/2007 |

OTHER PUBLICATIONS

Notice of Transmittal of the International Search Report of PCT/CN2016/081698 in Chinese, dated Nov. 4, 2016.

Written Opinion of the International Searching Authority of PCT/CN2016/081698 in Chinese, dated Nov. 4, 2016 with English translation.

Chinese Office Action in Chinese Application No. 201610081276.6, dated Dec. 1, 2017 with English translation.

Second Chinese Office Action in Chinese Application No. 201610081276.6, dated Aug. 29, 2018 with English translation.

* cited by examiner

DISPLAY DEVICE HAVING THE BUMPS IN THE MIDDLE ZONE PARALLEL TO THE REFERENCE LINE

CROSS REFERENCE TO RELATED APPLICATIONS

This application is the National Stage of PCT/CN2016/081698 filed on Nov. 5, 2016, which claims priority under 35 U.S.C. § 119 of Chinese Application No. 201610081276.6 filed on Feb. 4, 2016, the disclosure of which is incorporated by reference.

TECHNICAL FIELD

Embodiments of the present invention relate to a display device and a chip bonding method for the display device.

BACKGROUND

In recent years, flexible display technologies have been research hotspots in the area of display technologies. Flexible displays have advantages of being thinner, more shock resistant and lighter, and will be widely applied in commercial and military areas. A flexible display may be defined as a display in which a very thin flexible substrate that can be bent to a curvature radius of a few centimeters or even smaller without impairing the display function of the display panel is used as the substrate of the display panel.

SUMMARY

Embodiments of the present disclosure provide a display device and a chip bonding method thereof At least one embodiment of the present disclosure provides a display device. The display device comprises a flexible display panel and a chip boned to a non-display area of the flexible display panel. The chip has two rows of multiple mutually independent bumps, with one row on a side near a display area of the flexible display panel and the other row on a side away from the display area. The flexible display panel has bumps in one-to-one correspondence with those bumps of the chip. Every two bumps in one-to-one correspondence are electrically connected through press bonding. Depending on a area in which the bumps are located, the extension directions of the bumps satisfy the requirements that: in each row of bumps, at least the individual bumps in lateral zones have their extension lines on the side near the display area converging at a same point on a reference line; or in each row of bumps, at least the individual bumps in the lateral zones have their extension lines on a side away from the display area converging at a same point on the reference line; two bumps in one-to-one correspondence belong to a same bump group, the two bumps in the same bump group have their extension lines respectively forming an angle with respect to the reference line, the angles being equal to each other. The reference line is a straight line located in a middle zone and perpendicular to a first direction, the first direction being an arrangement direction of a row of the bumps, the middle zone is a zone located in the middle of the non-display area in the first direction, and the lateral zones are zones located on two sides of the middle zone.

In an example, the reference line is the central axis of the middle zone.

In an example, the lateral zones on two sides of the middle zone are symmetric.

In an example, in each row of bumps, the bumps in the two lateral zones on two sides of the middle zone are distributed symmetrically with respect to the reference line that acts as a symmetric axis.

In an example, in all of the lateral zones, the bumps with the same distance from the reference line have their extension lines forming a same angle with respect to the reference line.

In an example, the two bumps belong to the same bump group are similar in shapes.

In an example, in the two bumps within the same bump group, the bump on the chip has an area smaller than that of the bump on the flexible display panel.

In an example, the bumps located in the middle zone are parallel to the reference line.

In an example, in each row of bumps, one bump group is disposed in the middle zone.

In an example, the display device further comprises alignment markings used for alignment, which are located in one row of bump groups and respectively located on the individual bumps in one of the bump groups in a lateral zone. The alignment markings on the bumps within a same row have lines connected therebetween perpendicular to the reference line.

In an example, in the display device, when the bumps in the two lateral zones on two sides of the middle zone are distributed symmetrically with respect to the reference line that acts as the symmetric axis, the alignment markings on the bumps within the same row are distributed symmetrically with respect to the reference line that acts as the symmetric axis.

At least one embodiment of the present disclosure also provides a chip bonding method for the display unit, comprising: aligning the flexible display panel with the chip in the first direction, and locating the two alignment markings on the chip and the two alignment markings on the flexible display panel on a same horizontal line; determining whether the two alignment markings on the flexible display panel are in alignment with the two alignment markings on the chip, or not; if yes, press bonding the flexible display panel with the chip; if no, determining a difference between a length between the two alignment markings on the flexible display panel and a length between the two alignment markings on the chip; determining a value of a relative displacement that needs to be made between the chip and the flexible display panel in a direction perpendicular to the first direction based on the difference and the angle formed by an extension line of one bump, on which an alignment marking is located, with respect to the reference line; and moving the chip and/or the flexible display panel according to the determined value of the relative displacement and then press bonding the chip and the flexible display panel.

For example, in the chip bonding method for the display unit, when the bumps in the two lateral zones on the two sides of the middle zone are distributed symmetrically with respect to the reference line that acts as the symmetric axis and the alignment markings on the bumps within the same row are also distributed symmetrically with respect to the reference line that acts as the symmetric axis, the value of the relative displacement to be made between the chip and the flexiable display panel in the direction perpendicular to the first direction is determined according to an equation:

$$h = \frac{l \cdot \cot a}{2},$$

where l represents the difference between the length between the two alignment markings on the flexible display panel and the length between the two alignment markings on the chip, and a represents the angle formed by the extension line of one bump, on which an alignment marking is located, with respect to the reference line.

BRIEF DESCRIPTION OF THE DRAWINGS

Embodiments of the present disclosure will be described in more detail below with reference to accompanying drawings to allow an ordinary skill in the art to more clearly understand embodiments of the present disclosure, in which:

FIG. 1c is a schematic structural diagram of a chip in the display device shown in FIG. 1a;

FIG. 1d is a schematic structural diagram of a flexible display panel in the display device shown in FIG. 1a;

FIG. 1e is a schematic structural diagram of the flexible display panel bonded with the chip in the display device shown in FIG. 1a;

DETAILED DESCRIPTION

Technical solutions according to the embodiments of the present disclosure will be described clearly and fully as below in conjunction with the accompanying drawings of embodiments of the present disclosure. It is apparent that the described embodiments are just a part but not all of the embodiments of the disclosure. Based on the described embodiments herein, a person of ordinary skill in the art can obtain other embodiment(s), without any creative work, which shall be within the scope of the present disclosure.

Unless otherwise defined, all the technical and scientific terms used herein have the same meanings as commonly understood by one of ordinary skill in the art to which the present disclosure belongs. The terms, such as "first," "second," or the like, which are used in the description and the claims of the present application, are not intended to indicate any sequence, amount or importance, but for distinguishing various components. The terms, such as "comprise/comprising," "include/including," or the like are intended to specify that the elements or the objects stated before these terms encompass the elements or the objects and equivalents thereof listed after these terms, but not preclude other elements or objects. The terms, "on," "under," or the like are only used to indicate relative position relationship, and if the position of the object which is described is changed, the relative position relationship may be changed accordingly.

During fabricating a flexible display device, a flexible substrate is fixed on a glass substrate at first, then subsequent fabricating processes for a flexible display panel are performed, the processes being compatible with equipment for fabricating the display panel. When the fabricating of the flexible display panel is completed, the flexible substrate is separated from the glass substrate and a backing film is attached to the back of the flexible substrate to flatten the flexible substrate, then, processes, such as chip bonding, cutting, or the like, are performed.

The flexible display panel separated from the glass substrate is very thin and prone to slight dimensional variation under the force exerted in the backing film attaching process. During the subsequent chip bonding, since bumps on the chip are relatively dense and sensitive to dimensional variation, the dimensional variation of the flexible display panel may lead to misalignment between the bumps on the flexible display panel and those on the chip, circuit interruption, or other problems, which will impact the production yield.

In the following, examples of the display device and the chip bonding method thereof provided in embodiments of the present disclosure will be described in details with reference to accompanying figures.

The shapes and sizes of the components in the accompanying drawings do not reflect the real scale of the display device, but for schematically illustrating the contents of the embodiments of the present disclosure.

Figure 1A:
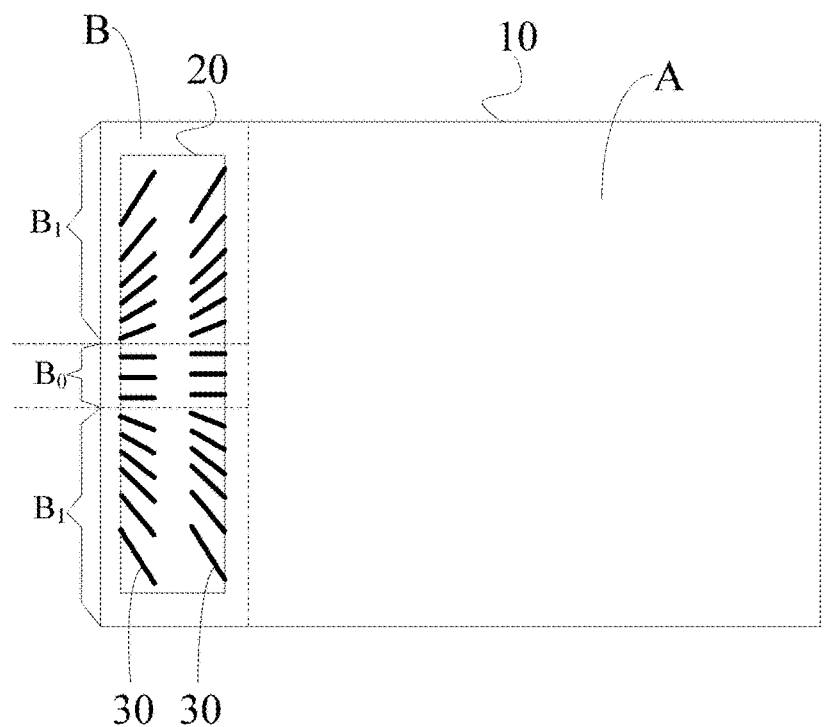
FIG. 1a is a schematic structural diagram of a display device provided in an embodiment of the present disclosure.
Figure 1B:
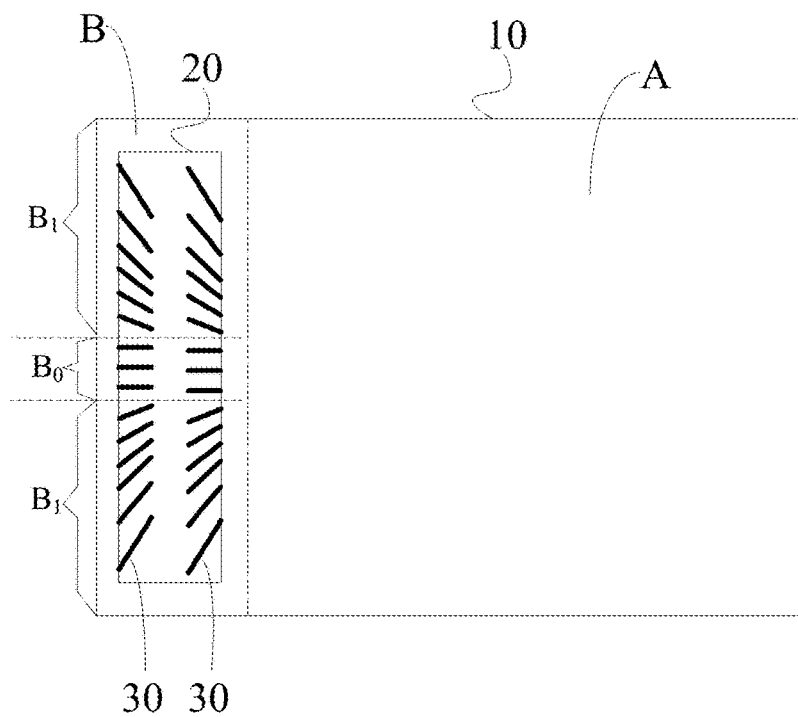
FIG. 1b is another schematic structural diagram of a display device provided in an embodiment of the present disclosure.

An embodiment of the present disclosure provides a display device, as shown in FIGS. 1a and 1b, comprises a flexible display panel 10 and a chip 20 bonded to a non-display area B of the flexible display panel 10. The chip 20 has two rows of multiple mutually independent bumps 30 disposed thereon, one row on the side near the display area A of the flexible display panel 10 and the other on the side away from the display area A. The flexible display panel 10 has bumps 30 in one-to-one correspondence with the individual bumps 30 on the chip 20. Every two bumps 30 in one-to-one correspondence with each other are electrically connected through press bonding. The extending directions of the individual bumps 30 satisfy, depending on the area in which the bumps are located, the following requirement.

Figure 1C:
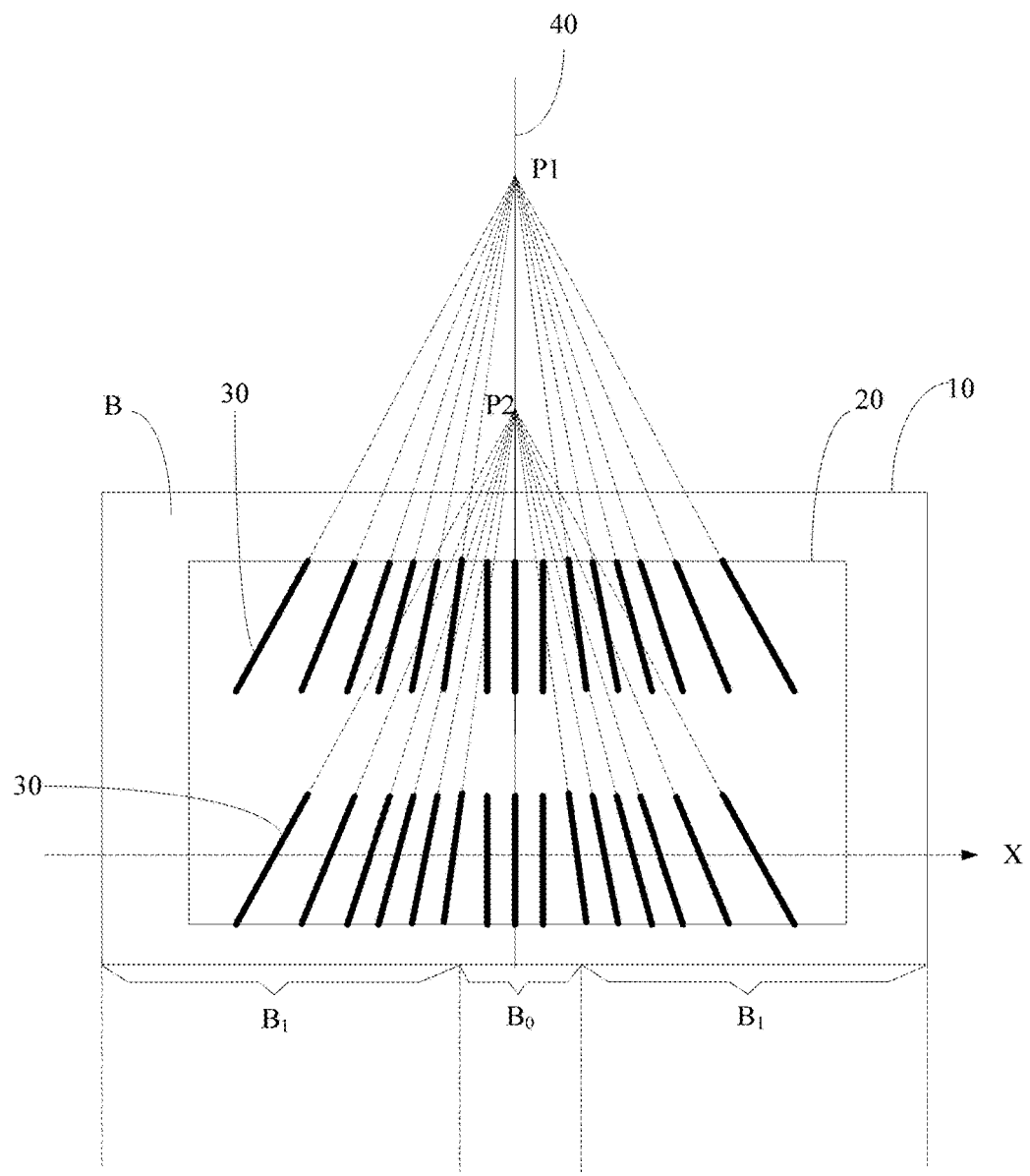
Figure 1D:
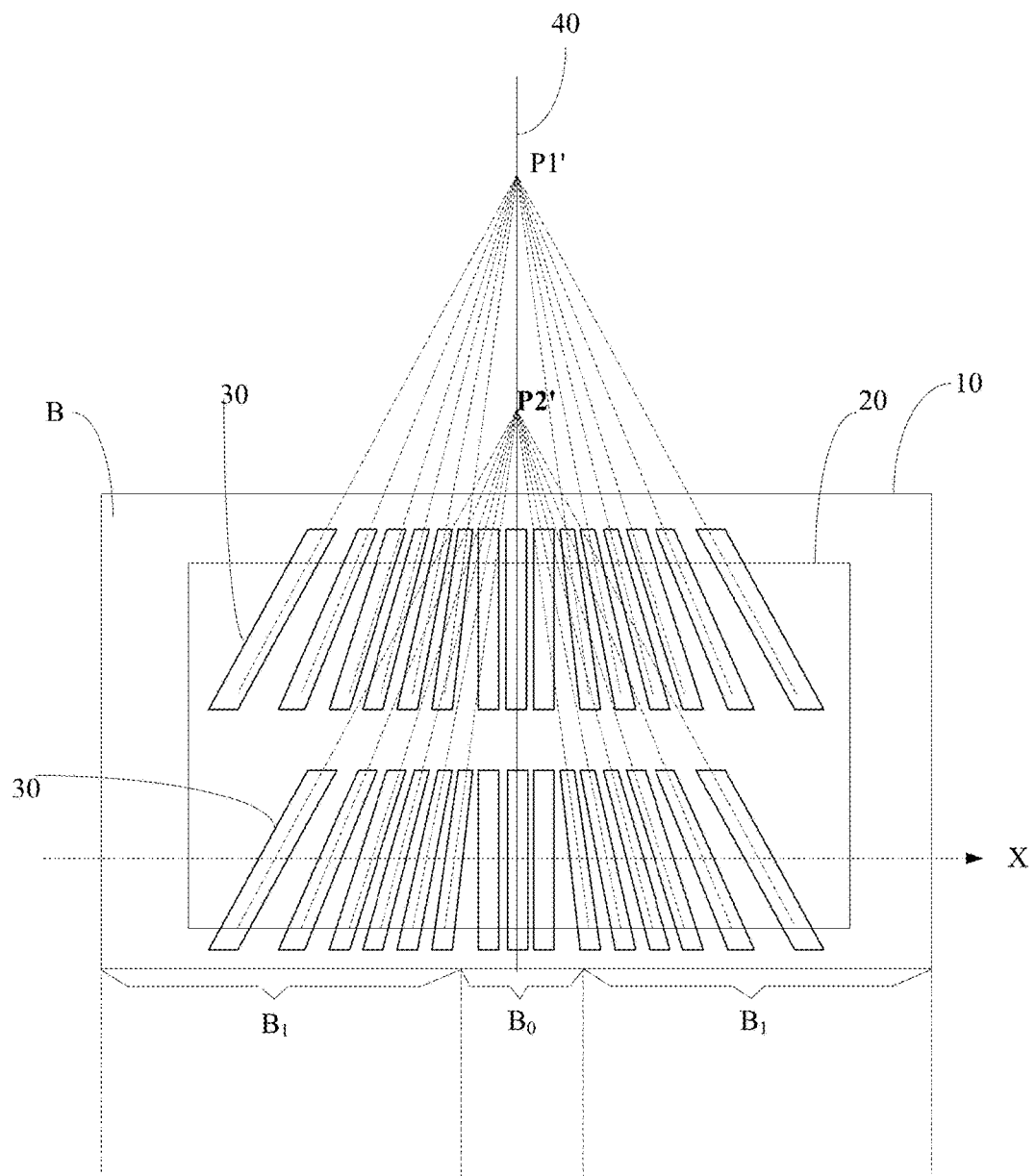
Figure 1E:
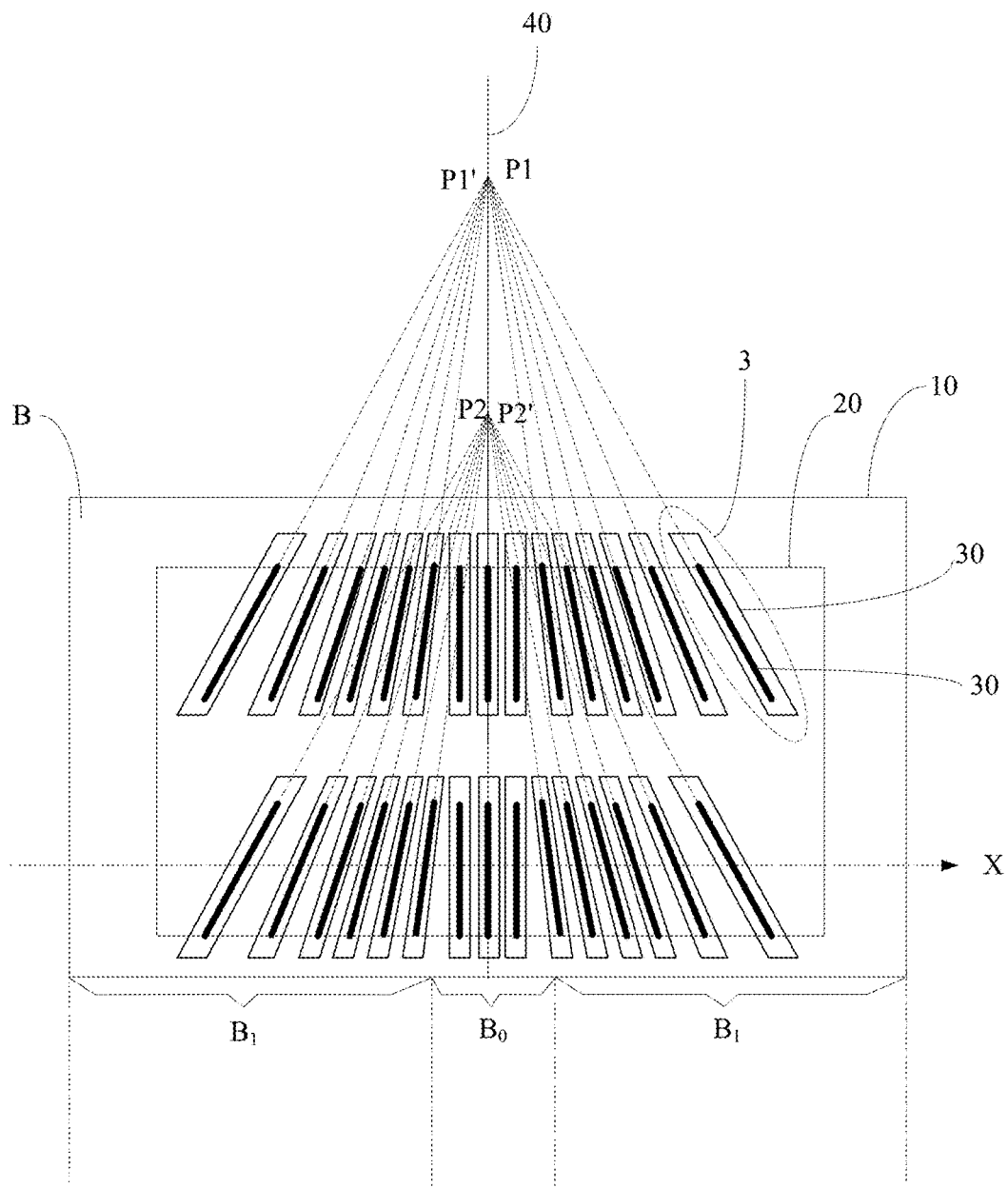

As shown in FIG. 1b, in each row of bumps 30, at least individual bumps 30 in lateral zones have their extension lines on the side near the display area converging at a same point on a reference line 40 (not shown in FIG. 1b), or, as shown in FIGS. 1a, 1c and 1d, in each row of bumps 30, at least individual bumps 30 in lateral zones $B_1$ have their extension lines on the side away from the display area A converging at a same point (e.g. P1 and P2 shown in FIG. 1c, and P1' and P2' shown in FIG. 1d) on the reference line 40. In addition, as shown in FIG. 1e, every two bumps 30 in one-to-one correspondence belong to one bump group 3, the two bumps 30 within the same bump group 3 have their extension lines respectively forming an angle with respect to the reference line 40, and the angles are equal to each other.

The reference line 40 is a straight line located in the middle zone $B_0$ and perpendicular to a first direction X which is the arrangement direction of a row of bumps 30. The middle zone $B_0$ is the zone that is located in the middle of the non-display area B in the first direction X, and the lateral zones $B_1$ are zones located on two sides of the middle zone B0.

The display device provided in the embodiment of the present disclosure comprises a flexible display panel and a chip bonded to the non-display area of the flexible display panel. The extension directions of the bumps satisfy the following requirements: in each row of bumps, at least the individual bumps in the lateral zones have their extension lines on the side away from or near the display area converging at a same point on the reference line, and two bumps belong to the same bump group have their extension lines respectively forming an angle with respect to the reference line, and the angles are equal to each other. In this way, if the flexible display panel has dimensional variation in the first direction, since in each row of bumps those in the lateral zones have their extension lines all converging at the same point on the reference line, when the chip is to be bonded to the flexible display panel, relative locations of the flexible display panel and the chip in the direction perpendicular to the first direction may be adjusted before the bonding to allow proper alignment between the chip bumps and the flexible display panel bumps as long as the dimensional variation of the flexible display panel in the first direction is within a certain range, which can improve the yield of chip bonding in the display device.

It is noted that, in the display device provided in the embodiment of the present disclosure, since in one row of bumps at least the individual bumps in the lateral zones have their extension lines on the same side converging at a same point on the reference line, in one row of bumps, the further a bump is from the reference line, the bigger the angle that the extension line of the bump forms with respect to the reference line is.

Figure 2:
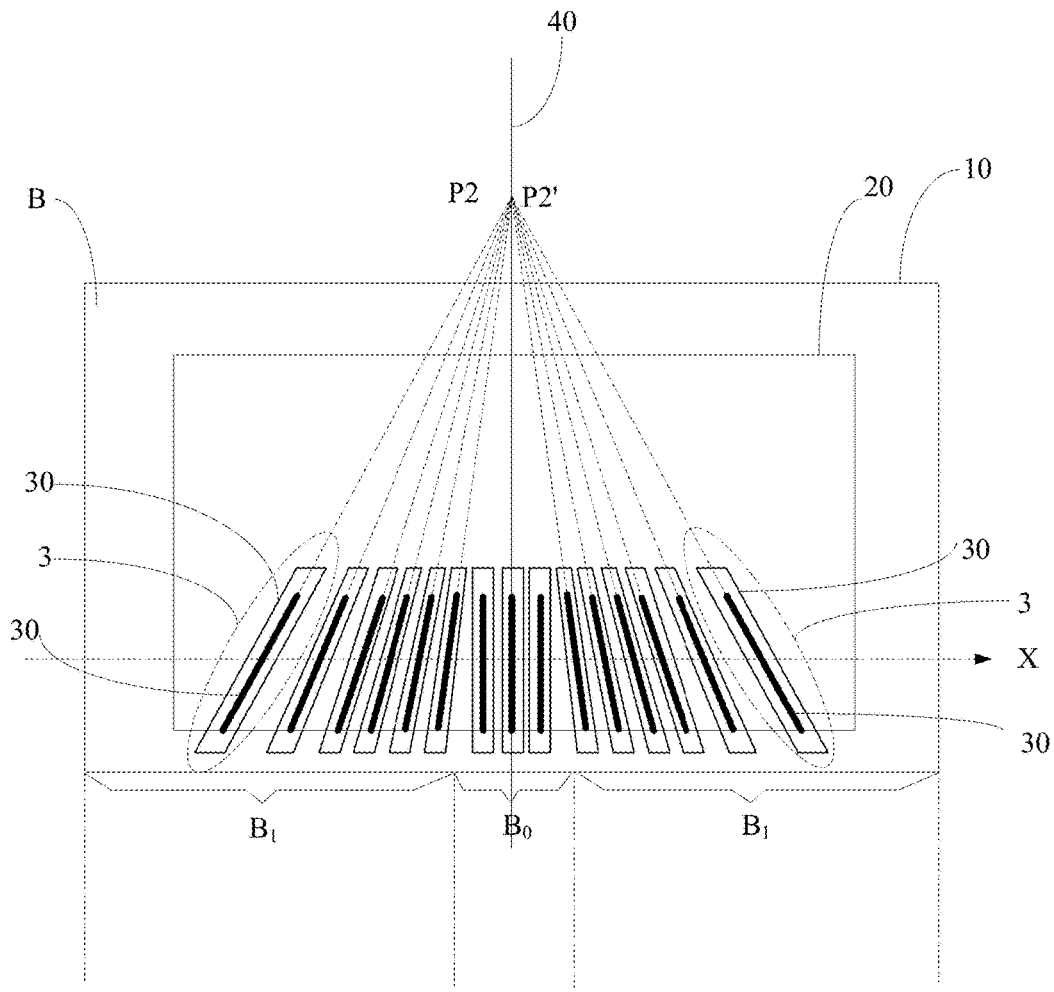
FIG. 2 is a schematic structural diagram of a display device provided in an embodiment of the present disclosure.

During implementation, the lateral zones of the flexible display panel are more prone to being deformed than the middle zone. For example, in the display device provided in an embodiment of the present disclosure, as shown in FIG. 2, the reference line 40 is the central axis of the middle zone $B_0$, however, embodiments of the present disclosure are not limited thereto. FIG. 2 is explained with the row of bump groups 3 near the display area as an example, however, embodiments of the present disclosure are not limited thereto.

For example, in the display device provided in an embodiment of the present disclosure, as shown in FIG. 2, the lateral zones on two sides of the middle zone $B_0$ are symmetric, but embodiments of the present disclosure are not limited thereto.

For example, in the display device provided in an embodiment of the present disclosure, as shown in FIG. 2, in each row of bumps, the bumps 30 in the two lateral zones $B_1$ on two sides of the middle zone $B_0$ are distributed symmetrically with respect to the reference line 40 that acts as the symmetric axis.

For example, in the display device provided in an embodiment of the present disclosure, as shown in FIG. 1e, in all the lateral zones $B_1$, the bumps 30 with the same distance from the reference line 40 have their extension lines forming a same angle with respect to the reference line 40. That is to say, the relationship between the two rows of bumps 30 on the chip 20 equals to that if being translated a distance equal to that the distance between the point P1 and the point P2 in the direction of the reference line 40, one row of bumps 30 will be located at the exact location of the other row of bumps 30. Similarly, the relationship between the two rows of bumps 30 on the flexible display panel 10 equals to that if being translated a distance equal to that the distance between the point P1' and the point P2' in the direction of the reference line 40, one row of bumps 30 will be located at the exact location of the other row of bumps 30.

For example, in the display device provided in an embodiment of the present disclosure, as shown in FIG. 2, two bumps 30 in a same bump group 3 are similar in shapes, which is in favour of increasing the contact area between the corresponding bumps.

For example, in the display device provided in an embodiment of the present disclosure, as shown in FIG. 2, in the two bumps 30 belong to the same bump group 3, the bump on the chip 20 has an area smaller than that of the one on the flexible display panel 10. Since the area of the chip is relatively small, it is difficult to form large bumps on the chip, but since the area of the flexible display panel is relatively large, bumps on the flexible display panel may be formed to have larger footprints. Therefore, when the chip is bonded to the flexible display panel that has dimensional variation, even though the alignment positions have changed comparing with those before the dimensional variation, the bumps on the chip can be allowed to contact those bumps on the flexible display panel.

Since the flexible display panel is prone to being deformed in the lateral zones and the deformation in the middle zone is relatively small, for example, in the display device provided in an embodiment of the present disclosure, as shown in FIG. 2, the bumps 30 in the middle zone $B_0$ are parallel to the reference line 40. In this way, the area of the chip 20 may be saved.

For example, to compensate for the deformation in the middle zone of the flexible display panel, for example, in the display device provided in an embodiment of the present disclosure, in each row of bumps, one bump group is disposed in the middle zone, i.e. in each row of bumps, only one bump is disposed in the middle zone; Likewise, in each row of bumps on the flexible display panel, one bump is disposed correspondingly in the middle zone, so that the middle zone has a relatively smaller area.

For example, since the deformation in the middle zone of the flexible display panel is relatively small and the deformation in the lateral zones is relatively large, in the display device provided in an embodiment of the present disclosure, the gap width between the bumps in the middle zone is smaller than that between the bumps in the lateral zones.

For example, in the display device provided in an embodiment of the present disclosure, the bigger the distance of a gap between bumps from the reference line is, the bigger the width of the gap is.

Figure 3A:
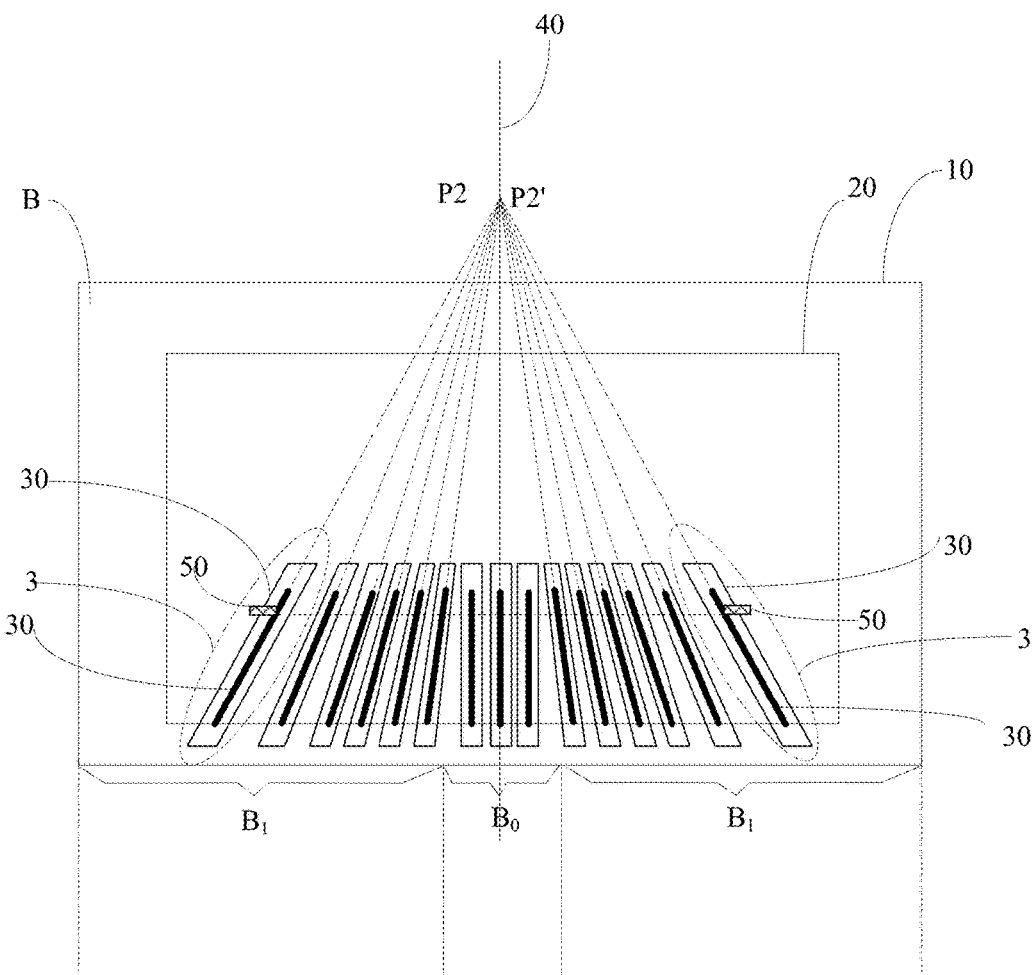
FIGS. 3a and 3b are respectively schematic structural diagrams of a display device provided in another embodiment of the present disclosure.
Figure 3B:
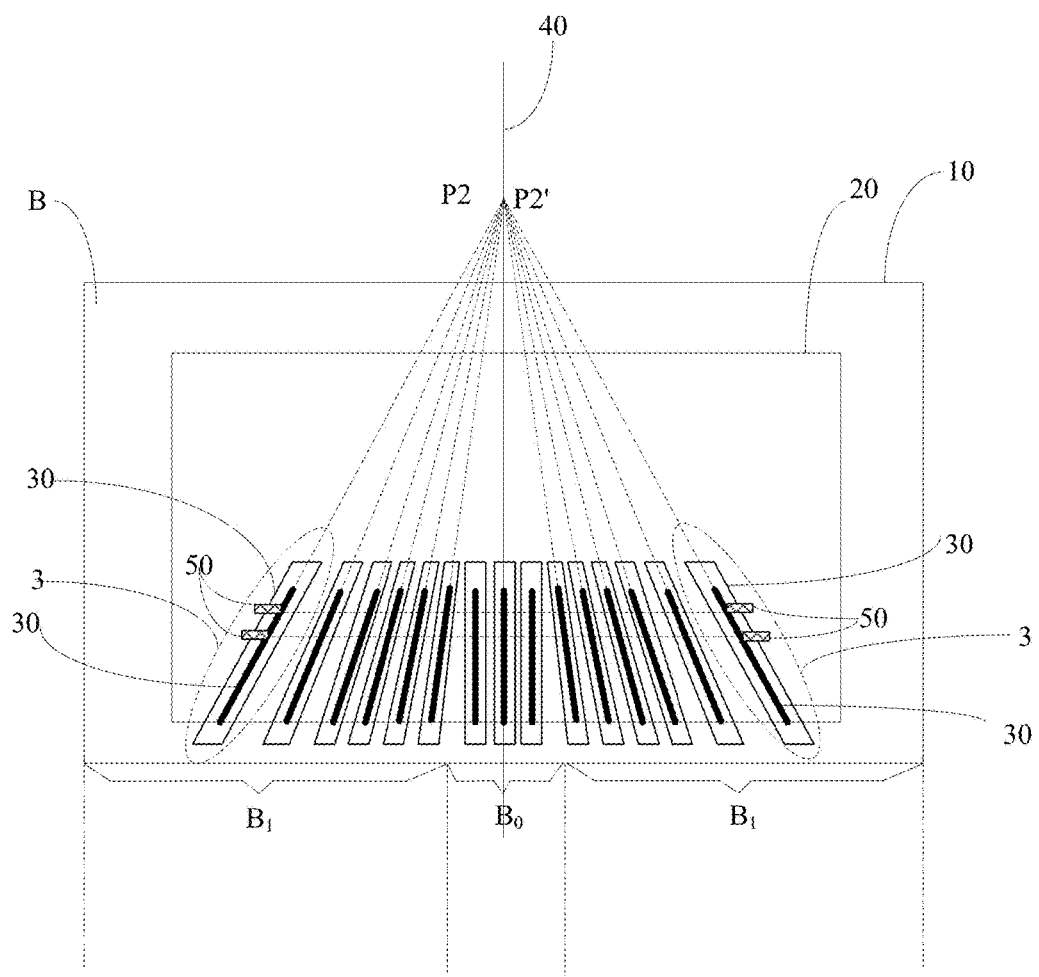

For example, the display device provided in an embodiment of the present disclosure, as shown in FIGS. 3a and 3b, further comprises alignment markings 50 used for alignment, which are located in one row of bump groups 3 and each located on the individual bumps 30 in one of the bump groups in a lateral zone $B_1$. The alignment markings 50 on the bumps within a same row have a connecting line therebetween perpendicular to the reference line 40.

For example, in the display device provided in an embodiment of the present disclosure, as shown in FIGS. 3a and 3b, if the bumps 30 in the two lateral zones $B_1$ on two sides of the middle zone $B_0$ are distributed symmetrically with respect to the reference line 40 that acts as the symmetric axis, the alignment markings 50 on the bumps in a same row are also distributed symmetrically with respect to the reference line 40 that acts as the symmetric axis.

As shown in FIG. 3a, if the flexible display panel 10 has no deformation, corresponding alignment markings will coincide after the flexible display panel 10 and the chip 20 are bonded. As shown in FIG. 3b, When the flexible display panel 10 has a deformation, corresponding alignment markings 50 may mismatch after the flexible display panel 10 and the chip 20 are bonded, and the direction of the line between the corresponding alignment markings 50 may be the same as the extension direction of the bumps 30 on which the markings are located. FIG. 3a and FIG. 3b are explained with respect to the row of bump groups 3 near the display area as an example.

Figure 4:
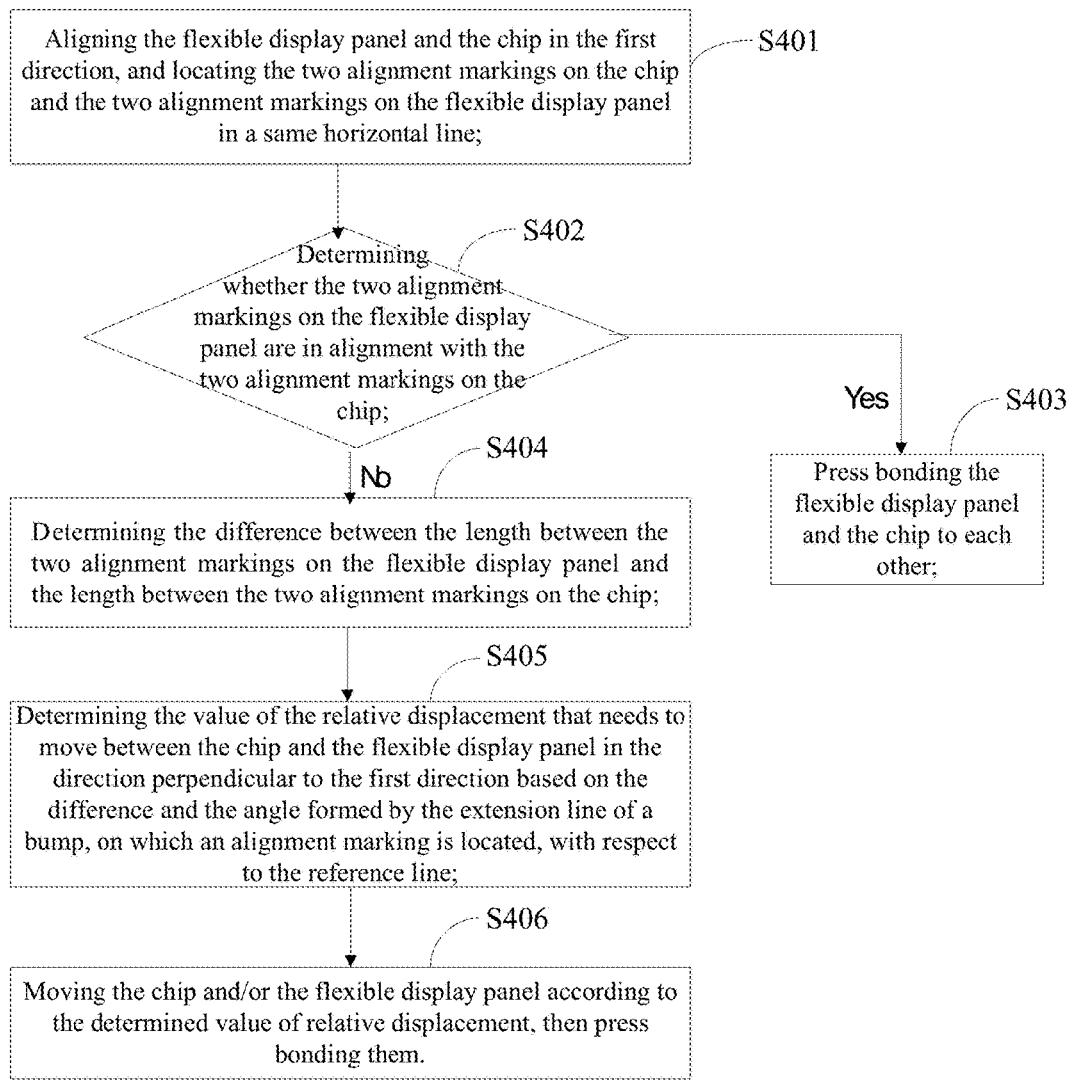
FIG. 4 is a flowchart of a chip bonding method for a display device provided in an embodiment of the present disclosure.

Based on the same concept, an embodiment of the present disclosure further provides a chip bonding method for the display device configured with alignment markings as described above. As shown in FIG. 4, the chip bonding method may comprise steps below.

Step S401, aligning the flexible display panel and the chip in the first direction, and locating the two alignment markings on the chip and the two alignment markings on the flexible display panel in a same horizontal line;

Step S402, determining whether the two alignment markings on the flexible display panel are in alignment with the two alignment markings on the chip, or not; if yes, step S403 is performed, or, if no, step S404 is performed;

Step S403, press bonding the flexible display panel and the chip to each other;

Step S404, determining the difference between the length between the two alignment markings on the flexible display panel and the length between the two alignment markings on the chip;

Step S405, determining the value of the relative displacement that needs to be made between the chip and the flexible display panel in the direction perpendicular to the first direction based on the difference and the angle formed by the extension line of a bump, on which an alignment marking is located, with respect to the reference line; and Step S406, moving the chip and/or the flexible display panel according to the determined value of relative displacement, then press bonding them.

Figure 5:
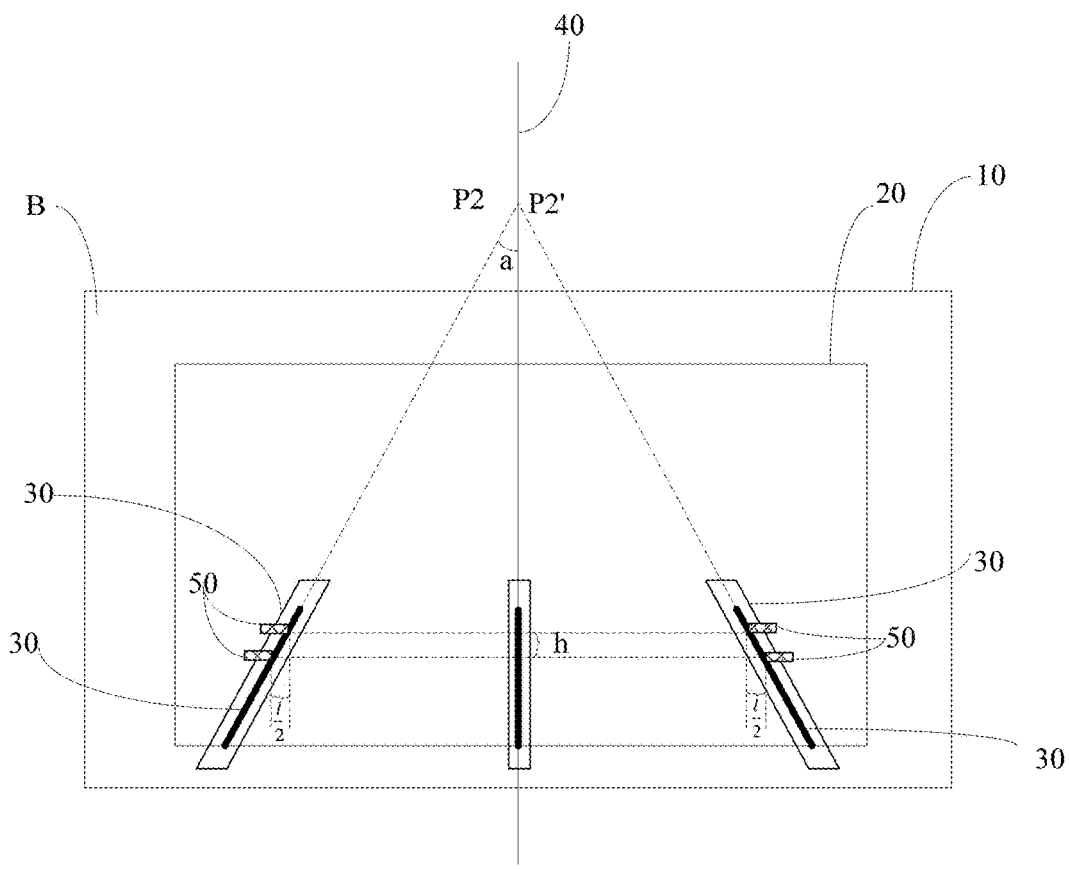
FIG. 5 is a schematic diagram illustrating a chip bonding method for a display device provided in an embodiment of the present disclosure.

For example, in the bonding method provided in an embodiment of the present disclosure, as shown in FIG. 5, if the bumps 30 in the two lateral zones $B_1$ on two sides of the middle zone $B_0$ are distributed symmetrically with respect to the reference line 40 that acts as the symmetric axis, and the alignment markings 50 on the bumps in a same row are also distributed symmetrically with respect to the reference line 40 that acts as the symmetric axis, the value of the relative displacement to be made between the chip 20 and the flexible display panel 10 in the direction perpendicular to the first direction X is determined according to the following equation:

$$h = \frac{l \cdot \cot a}{2},$$

where l represents the difference between the length between the two alignment markings 50 on the flexible display panel 10 and the length between the two alignment markings 50 on the chip 20, and a represents the angle formed by the extension line of a bump 30, on which an alignment marking is located, with respect to the reference line 40. FIG. 5 is explained with the bump groups configured with alignment markings as an example, however, embodiments of the present disclosure are not limited thereto.

In the described display device and chip bonding method provided in embodiments of the present disclosure, comprising: a flexible display panel and a chip bonded to the non-display area of the flexible display panel with the extension directions of individual bumps satisfying, depending on the area in which the bumps are located, the requirements that, in each row of bumps, at least the individual bumps in the lateral zones have their extension lines on the side away from, or near the display area converging at a same point on a reference line, and two bumps belong to a same bump group have their extension lines respectively forming an angle with respect to the reference line, and the angles are equal to each other. In this way, if the flexible display panel has dimensional variation in the first direction, since in each row of bumps, those in the lateral zones have their extension lines converging at a same point on the reference line, when the chip is to be bonded to the flexible display panel, relative locations of the flexible display panel and the chip in the direction perpendicular to the first direction may be adjusted before the bonding to allow proper alignment between the chip bumps and the flexible display panel bumps, as long as that the dimensional variation of the flexible display panel in the first direction is within a certain range (e.g., ±0.1%). The yield of chip bonding or connecting in the display device is increased.

The described above are only exemplary embodiments of the present disclosure, and the present disclosure is not intended to be limited thereto. For one of ordinary skill in the art, various changes and alternations may be made without departing from the technical scope of the present disclosure, and all of these changes and alternations shall fall within the scope of the present disclosure.

The present application claims priority of Chinese patent application No. 201610081276.6 filed on Feb. 4, 2016 and entitled "Display Device and Chip Bonding Method Thereof", the disclosure of which is incorporated herein in its entirety by reference.

What is claimed is:

1. A display device, comprising a flexible display panel and a chip bonded to a non-display area of the flexible display panel, wherein the chip has two rows of multiple mutually independent bumps, with one row on a side near a display area of the flexible display panel and the other row on a side away from the display area; the flexible display panel has bumps in one-to-one correspondence with those bumps of the chip; every two bumps in one-to-one correspondence are electrically connected through press bonding; depending on an area including a middle zone and two lateral zones on two sides of the middle zone distributed symmetrically with respect to a reference line, in which the bumps are located, respectively, the bumps satisfy the requirements that:

in each row of bumps, all of the bumps in each zone have their extension lines converging at a same point on an extension line of the reference line, and have a similar shape in each same zone, respectively, and all of the bumps in the middle zone are substantially parallel to the reference line;

wherein the reference line is a straight line located in the middle zone and perpendicular to a first direction, the first direction being an arrangement direction of a row of the bumps.

2. The display device according to claim 1, wherein the reference line is the central axis of the middle zone.

3. The display device according to claim 2, wherein in all of the lateral zones, the bumps with the same distance from the reference line have their extension lines forming a same angle with respect to the reference line.

4. The display device according to claim 1, wherein in each row of bumps, the bumps in the two lateral zones on two sides of the middle zone are distributed symmetrically with respect to the reference line that acts as a symmetric axis.

5. The display device according to claim 4, wherein in all of the lateral zones, the bumps with the same distance from the reference line have their extension lines forming a same angle with respect to the reference line.

6. The display device according to claim 5, wherein the two bumps belong to the same bump group are similar in shapes.

7. The display device according to claim 6, wherein in the two bumps within the same bump group, the bump on the chip has an area smaller than that of the bump on the flexible display panel.

8. The display device according to claim 7, wherein the bumps located in the middle zone are parallel to the reference line.

9. The display device according to claim 8, further comprising alignment markings used for alignment, which are located in one row of bump groups and respectively located on the individual bumps in one of the bump groups in at least one of the lateral zones, wherein the alignment markings on the bumps within a same row have lines connected therebetween perpendicular to the reference line.

10. The display device according to claim 1, wherein the two bumps belong to the same bump group are similar in shapes.

11. The display device according to claim 10, wherein in the two bumps within the same bump group, the bump on the chip has an area smaller than that of the bump on the flexible display panel.

12. The display device according to claim 1, wherein in each row of bumps, one bump group is disposed in the middle zone.

13. The display device according to claim 1, further comprising alignment markings used for alignment, which are located in one row of bump groups and respectively located on the individual bumps in one of the bump groups in at least one of lateral zones, wherein the alignment markings on the bumps within a same row have lines connected therebetween perpendicular to the reference line.

14. The display device according to claim 13, wherein when the bumps in the two lateral zones on two sides of the middle zone are distributed symmetrically with respect to the reference line that acts as the symmetric axis, the alignment markings on the bumps within the same row are distributed symmetrically with respect to the reference line that acts as the symmetric axis.

* * * * *

UNITED STATES PATENT AND TRADEMARK OFFICE
CERTIFICATE OF CORRECTION

PATENT NO.         : 10,242,605 B2
APPLICATION NO.    : 15/531181
DATED              : March 26, 2019
INVENTOR(S)        : Chen et al.

It is certified that error appears in the above-identified patent and that said Letters Patent is hereby corrected as shown below:

On the Title Page

Item (22), Please replace the filing date for PCT/CN2016/081698 from "November 5, 2016" with --May 11, 2016--.

Signed and Sealed this
Twenty-first Day of July, 2020

Andrei Iancu
*Director of the United States Patent and Trademark Office*